United States Patent
Kudo et al.

(10) Patent No.: US 8,716,728 B2
(45) Date of Patent: May 6, 2014

(54) NITRIDE SEMICONDUCTOR LIGHT-EMITTING DIODE DEVICE

(75) Inventors: Hiromitsu Kudo, Ushiku (JP); Hirokazu Taniguchi, Amagasaki (JP); Hiroaki Okagawa, Ushiku (JP); Shin Hiraoka, Ushiku (JP); Takahide Joichi, Ushiku (JP); Toshihiko Shima, Ushiku (JP)

(73) Assignee: Mitsubishi Chemical Corporation, Tokyo (JP)

( * ) Notice: Subject to any disclaimer, the term of this patent is extended or adjusted under 35 U.S.C. 154(b) by 360 days.

(21) Appl. No.: 12/446,385

(22) PCT Filed: Oct. 19, 2007

(86) PCT No.: PCT/JP2007/070484
§ 371 (c)(1),
(2), (4) Date: Jul. 7, 2009

(87) PCT Pub. No.: WO2008/047923
PCT Pub. Date: Apr. 24, 2008

(65) Prior Publication Data
US 2010/0314642 A1    Dec. 16, 2010

(30) Foreign Application Priority Data

Oct. 20, 2006 (JP) ................................. 2006-287022
Dec. 29, 2006 (JP) ................................. 2006-356835
Jan. 30, 2007 (JP) ................................. 2007-020206
Feb. 16, 2007 (JP) ................................. 2007-036267

(51) Int. Cl.
*H01L 33/22* (2010.01)
(52) U.S. Cl.
CPC ....................................... *H01L 33/22* (2013.01)
USPC ........................ 257/98; 257/99; 257/E33.068
(58) Field of Classification Search
None
See application file for complete search history.

(56) References Cited

U.S. PATENT DOCUMENTS

| | | | |
|---|---|---|---|
| 3,813,587 A | 5/1974 | Umeda et al. | |
| 5,923,053 A | 7/1999 | Jakowetz et al. | |
| 6,169,298 B1 * | 1/2001 | Lin et al. | 257/103 |
| 6,946,788 B2 | 9/2005 | Suehiro et al. | |

(Continued)

FOREIGN PATENT DOCUMENTS

| | | |
|---|---|---|
| JP | 9-116196 A | 5/1997 |
| JP | 2002-280611 A | 9/2002 |

(Continued)

OTHER PUBLICATIONS

International Bureau of WIPO, International Preliminary Report on Patentability in International Application No. PCT/JP2007/070484 (Apr. 22, 2009), English translation.

(Continued)

*Primary Examiner* — Calvin Lee
*Assistant Examiner* — Abul Kalam
(74) *Attorney, Agent, or Firm* — Leydig, Voit & Mayer, Ltd.

(57) ABSTRACT

A nitride semiconductor light-emitting diode element 1 includes a nitride semiconductor layer 12 having a bottom surface and an upper surface and containing a light emitting layer 12b inside, and a supporting substrate 11 made from a metal is bonded to the bottom surface of the nitride semiconductor layer 12. A light reflecting depression A1 to reflect light generated in the light emitting layer 12b is formed in the bottom surface of the nitride semiconductor layer 12. According to the nitride semiconductor light-emitting diode element 1, since the light generated from the light emitting layer 12b and propagated in the nitride semiconductor layer 12 in a layer direction is reflected by the light reflecting depression A1 and its travel direction is changed, the ratio of the light incident upon the upper surface of the nitride semiconductor layer 12 within a critical angle is increased. Thus, light extraction efficiency is improved as compared with a conventional nitride semiconductor light-emitting diode element.

8 Claims, 11 Drawing Sheets

(56) References Cited

U.S. PATENT DOCUMENTS

| | | | |
|---|---|---|---|
| 7,087,933 B2 * | 8/2006 | Takeda et al. | 257/94 |
| 2002/0167983 A1 | 11/2002 | Marutani et al. | |
| 2003/0143772 A1 * | 7/2003 | Chen | 438/47 |
| 2004/0087252 A1 * | 5/2004 | Huang | 451/41 |
| 2004/0113166 A1 | 6/2004 | Tadatomo et al. | |
| 2004/0135166 A1 * | 7/2004 | Yamada et al. | 257/103 |
| 2005/0269577 A1 * | 12/2005 | Ueda et al. | 257/80 |
| 2006/0157717 A1 * | 7/2006 | Nagai et al. | 257/81 |
| 2006/0261355 A1 * | 11/2006 | Kususe et al. | 257/79 |

FOREIGN PATENT DOCUMENTS

| | | |
|---|---|---|
| JP | 2004-179347 A | 6/2004 |
| JP | 2006-210730 A | 8/2006 |
| JP | 2007-149875 A | 6/2007 |
| JP | 2007-173569 A | 7/2007 |

OTHER PUBLICATIONS

Japanese Patent Office, International Search Report in International Patent Application No. PCT/JP2007/070484 (Jan. 29, 2008), English translation.

Japanese Patent Office, Notice of Reasons for Refusal in Japanese Patent Application No. 2007/020206 (Jun. 19, 2012), English translation.

* cited by examiner (a) — bottom surface of nitride semiconductor layer 12

(b) — bottom surface of nitride semiconductor layer 12

(c) — bottom surface of nitride semiconductor layer 12 bottom surface of nitride semiconductor layer 12

(a)

(b)

(c)

(g)

(h)

(a)

bottom surface of nitride semiconductor layer 12

(b)

bottom surface of nitride semiconductor layer 12

(c)

bottom surface of nitride semiconductor layer 12

(d)

bottom surface of nitride semiconductor layer 12

(e)

bottom surface of nitride semiconductor layer 12

(f)

bottom surface of nitride semiconductor layer 12

NITRIDE SEMICONDUCTOR LIGHT-EMITTING DIODE DEVICE

TECHNICAL FIELD

The present invention relates to a nitride semiconductor light-emitting diode element with a main part of the light emitting device structure composed of a nitride semiconductor (hereinafter occasionally referred to as the "nitride LED").

The nitride semiconductor is a compound semiconductor represented by the chemical formula:

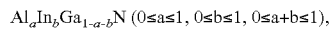
$Al_aIn_bGa_{1-a-b}N$ (0≤a≤1, 0≤b≤1, 0≤a+b≤1), which is also called a III group nitride semiconductor, a gallium nitride-based semiconductor and the like. A semiconductor in which a part of the III group element is replaced with B (boron), Tl (thallium) and the like, or a part of N (nitrogen) is replaced with P (phosphorous), As (arsenic), Sb (antimony), Bi (bismuth) and the like in the above chemical formula is also included in the nitride semiconductor.

A nitride LED with a vertical-type element structure is known, which includes a nitride semiconductor layer having a bottom surface and an upper surface and containing a light emitting layer inside, wherein a supporting substrate made of a metal or a semiconductor is bonded to the bottom surface of the nitride semiconductor layer (patent document 1 and patent document 2).

The light generated in the light emitting layer of the nitride LED having the above configuration is extracted from the upper surface of the nitride semiconductor layer.
patent document 1: US-B-2006/0154389
patent document 2: JP-A-2006-156950
patent document 3: JP-A-2003-218383
patent document 4: JP-A-2006-261659
patent document 5: JP-A-2004-134803
patent document 6: JP-A-2006-501656
patent document 7: JP-A-2005-302804
patent document 8: JP-A-2006-54295
non-patent document 1: Japanese Journal of Applied Physics, Vol. 45, No. 39, 2006, pp. L1045-L1047
non-patent document 2: Japanese Journal of Applied Physics, Vol. 44, No. 10, 2005, pp. 7414-7417

DISCLOSURE OF THE INVENTION

Problems to be Solved by the Invention

While the nitride LED is used in an encapsulated state with a light-transmissive material such as a resin and glass or in an airtight sealed state, since the refractive index of the nitride semiconductor is considerably higher than that of the resin, glass and air, the light extraction efficiency of the element becomes problematically low. That is, of the light generated in the light emitting layer, only the light incident upon the upper surface of the nitride semiconductor layer within a critical angle is efficiently emitted outside the element; however, since this critical angle is small, most light is propagated in the nitride semiconductor layer in a layer direction. The propagating light is absorbed by the light emitting layer and the like and converted to heat.

The present invention is made in view of the above situation, and its object is to provide a nitride LED having an increased light emitting output power achieved by improving the light extraction efficiency.

Means for Solving the Problems

In order to achieve the above object, nitride semiconductor light-emitting diode elements according to embodiments of the present invention have the following characteristics.

(1) A nitride semiconductor light-emitting diode element with a vertical-type element structure comprising a nitride semiconductor layer having a bottom surface and an upper surface and containing a light emitting layer inside, and a supporting substrate made of a metal or a semiconductor being bonded to the bottom surface of the nitride semiconductor layer wherein a light reflecting depression for reflecting the light generated in the light emitting layer to the upper surface side is formed in the bottom surface of the nitride semiconductor layer.

(2) The nitride semiconductor light-emitting diode element according to the above (1), wherein an outline shape of the bottom surface of the nitride semiconductor layer is square, and a groove is formed as the light reflecting depression in the bottom surface, and the groove has a part extending in a direction which crosses all the sides of the square at an angle from 10 degrees to 80 degrees.

(3) The nitride semiconductor light-emitting diode element according to the above (2), wherein the total length of the part is not less than 50% of the length of the diagonal line of the square.

(4) The nitride semiconductor light-emitting diode element according to the above (1), wherein a outline shape of the bottom surface of the nitride semiconductor layer is a quadrangle or hexagon, only one linear groove is formed in the bottom surface as the light reflecting depression along one diagonal line of the quadrangle or the hexagon, and the length of the groove is substantially equal to the length of the diagonal line.

(5) The nitride semiconductor light-emitting diode element according to the above (1), wherein a hole is formed in the bottom surface of the nitride semiconductor layer as the light reflecting depression.

(6) The nitride semiconductor light-emitting diode element according to the above (1), having a pad electrode on the upper surface of the nitride semiconductor layer, wherein the pad electrode is formed avoiding the part above the light reflecting depression.

(7) The nitride semiconductor light-emitting diode element according to the above (1), wherein the supporting substrate is a semiconductor substrate bonded to the nitride semiconductor layer by direct wafer bonding.

(8) The nitride semiconductor light-emitting diode element according to the above (1), having a light-transmissive thin film formed on and in contact with the bottom surface of the nitride semiconductor layer, the film being made of an oxide semiconductor and having a surface planarized by polishing, wherein a metal layer serving as a light reflecting film is laminated on the thin film.

(9) The nitride semiconductor light-emitting diode element according to the above (1), wherein a light-transmissive semiconductor layer derived from a semiconductor substrate used for growing the nitride semiconductor layer is bonded to the upper surface of the nitride semiconductor layer.

(10) A nitride semiconductor light-emitting diode element comprising a conductive substrate and a nitride semiconductor layer formed on the conductive substrate, the nitride semiconductor layer containing an n-type layer arranged at the most distant position from the conductive substrate, a light emitting layer arranged between the n-type layer and the conductive substrate, and a p-type layer arranged so as to sandwich the light emitting layer with the n-type layer, wherein a pad electrode is formed on the n-type layer, and a flat hole having a bottom surface is formed in the surface of the nitride semiconductor layer on the conductive substrate side to reach the light emitting layer, so as to face the pad electrode.

(11) The nitride semiconductor light-emitting diode element according to the above (10), wherein the flat hole is formed deep enough to remove the light emitting layer therefrom completely.

(12) The nitride semiconductor light-emitting diode element according to the above (10), wherein a light reflecting depression is formed in the surface of the nitride semiconductor layer on the conductive substrate side, in addition to the flat hole.

Effect of the Invention

According to the present invention, a high-power nitride semiconductor light-emitting diode element being preferably usable as a light source for an illuminating device can be provided.

EXPLANATION OF SYMBOLS 1, 2 nitride semiconductor light-emitting diode element
11, 21 supporting substrate
12, 22 nitride semiconductor layer
A1, A2 light reflecting depression

BEST MODE FOR CARRYING OUT THE INVENTION

Embodiment 1

Figure 1:
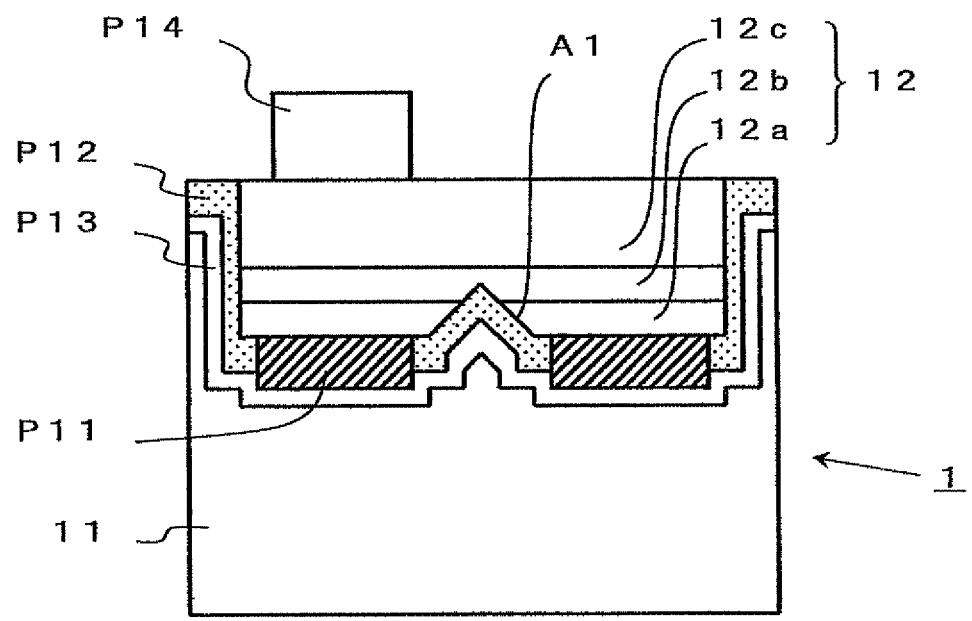
FIG. 1 is a cross-sectional view of a nitride semiconductor light-emitting diode element according to an embodiment of the present invention.

FIG. 1 is a sectional view of a nitride LED according to an embodiment of the present invention. The nitride LED 1 shown in FIG. 1 has a configuration in which a nitride semiconductor layer 12 is laminated on a supporting substrate 11 made of a metal. In other words, the metal supporting substrate 11 is bonded to the bottom surface of the nitride semiconductor layer 12. The nitride semiconductor layer 12 has a laminated structure in which a p-type layer 12a, a light emitting layer 12b, and an n-type layer 12c are laminated in this order from the bottom surface. A light reflecting depression A1 is formed in the bottom surface of the nitride semiconductor layer 12. The light reflecting depression A1 is a linear concave part, that is, a groove, and its longitudinal direction crosses the drawing sheet. A contact layer P11 is formed on the p-type layer 12a on the side opposite the side where the light emitting layer 12b is formed. In addition, an insulation film P12 is formed on the bottom surface and side surface of the nitride semiconductor layer 12 except for a region where the contact layer P11 is formed. A thin-film metal layer P13 is provided between the contact layer P11 and insulation film P12, and the supporting substrate 11. A pad electrode P14 is formed on a part of the upper surface of the nitride semiconductor layer 12.

Of light generated from the light emitting layer 12b in the nitride LED 1, the amount of light directly incident upon the upper surface of the nitride semiconductor layer 12 within a critical angle is small, and most light propagates in the nitride semiconductor layer 12 in a layer direction (direction parallel to the nitride semiconductor layer 12).

In a conventional nitride LED, such propagating light is mostly converted to heat in a nitride semiconductor layer and is lost. Meanwhile, in the nitride LED 1, at least a part of the propagating light is reflected by the light reflecting depression A1 and changes its traveling direction. As a result, the amount of the light incident upon the upper surface of the nitride semiconductor layer 12 within a critical angle is increased, and therefore the amount of light emitted from the upper surface of the nitride semiconductor layer 12 to the outside the element is increased.

Since the light reflecting depression A1 is in the shape of a line (groove), the probability that the light propagating in the nitride semiconductor layer 12 in the lateral direction reaches the light reflecting depression A1 to be reflected by it is higher than that when it is in the shape of a dot (hole). When the linear light reflecting depression is formed in the bottom surface of the nitride semiconductor layer 12, its number may be one.

Figure 2:
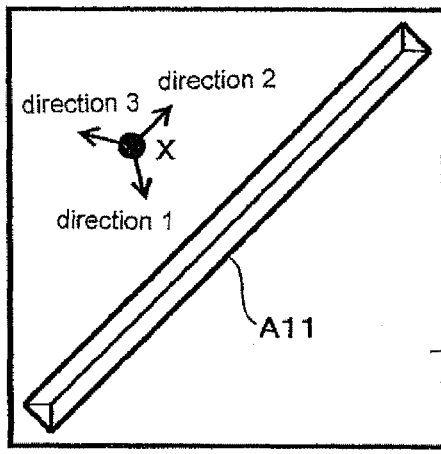
FIG. 2 is a schematic explanation of a mechanism which effectively improves a light extraction efficiency in the nitride semiconductor light-emitting diode element according to an embodiment of the present invention.
Figure 2:
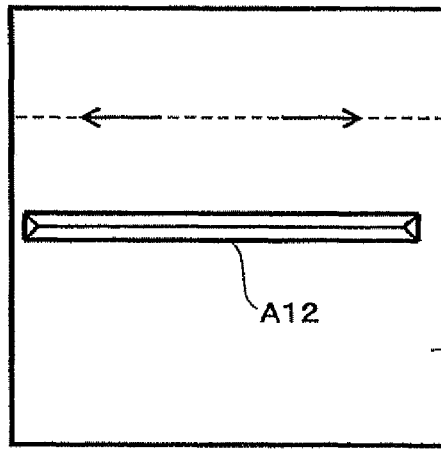
Figure 2:
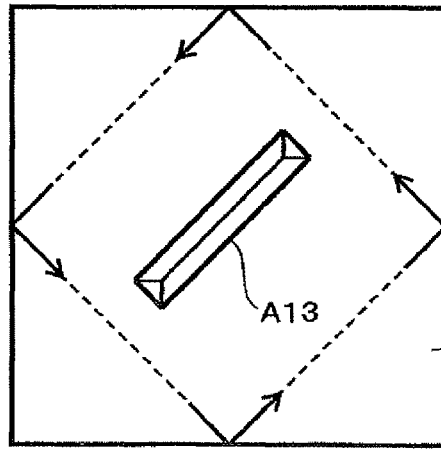

In case of forming only one linear light reflecting depression A1 in the bottom surface of the nitride semiconductor layer having a square or hexagonal bottom surface outline shape, when the depression is formed along one of the diagonal lines of the square or hexagon and its length is substantially equal to the length of the diagonal line, light extraction efficiency can be effectively improved. Its mechanism will be described with reference to FIG. 2.

In an example shown in FIG. 2(a), the bottom surface of the nitride semiconductor layer 12 is square and a linear light reflecting depression A11 having substantially the same length as that of the diagonal line is formed along one of the diagonal lines. While the light generated at a position X and propagating in the nitride semiconductor layer 12 travels in any of the direction approaching the light reflecting depression A11 (direction 1), the direction parallel to the light reflecting depression A11 (direction 2), or the direction away from the light reflecting depression A11 (direction 3), the light traveling in any of the three directions is reflected by the light reflecting depression A11.

The light traveling in the direction 1 is naturally reflected by the light reflecting depression A11, but the light traveling in the direction 2 or direction 3 also changes its traveling direction while being reflected by the side surface of the nitride semiconductor layer 12 to reach the light reflecting depression A11.

Meanwhile, in an example shown in FIG. 2(b), where the light reflecting depression A12 is formed parallel to one side of the square, the propagating light shown by an arrow in FIG. 2(b) never reaches the light reflecting depression A12 because its traveling direction is always parallel to the light reflecting depression A12 even when being reflected by the side surface of the nitride semiconductor layer 12.

In addition, in an example shown in FIG. 2(c), where the light reflecting depression A13 is formed along a diagonal line, but its length is considerably shorter than the diagonal line, there exists a propagating light like the propagating light shown by an arrow in FIG. 2(c), which does not reach the light reflecting depression A13 even after being reflected by the side surface of the nitride semiconductor layer 12 to change its traveling direction.

Therefore, when providing only one straight-line shape light reflecting depression, it is most preferable to provide it as shown in FIG. 2(a).

The length substantially equal to that of the diagonal line described above means a length that is 50% to 100% of the length of the diagonal line. In this embodiment, the length of the light reflecting depression is preferably 70% to 100%, more preferably 90% to 100%, of the length of the diagonal line. However, the present invention never excludes the formation modes of the light reflecting depressions as shown in FIGS. 2(b) and (c). In the above explanation, the diagonal line in the hexagonal shape means a straight line connecting one certain angle to the most distant angle therefrom.

Figure 8:
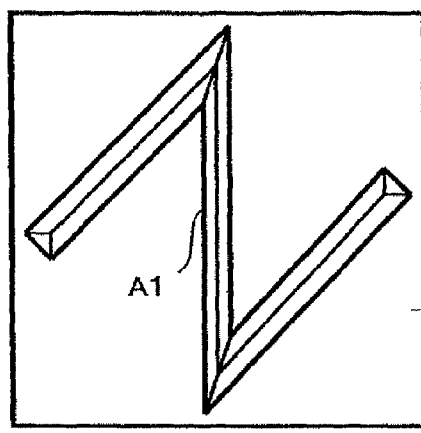
FIG. 8 is a view of a bottom surface of a nitride semiconductor layer with a light reflecting depression formed in it, in the nitride semiconductor light-emitting diode element according to an embodiment of the present invention.
Figure 8:
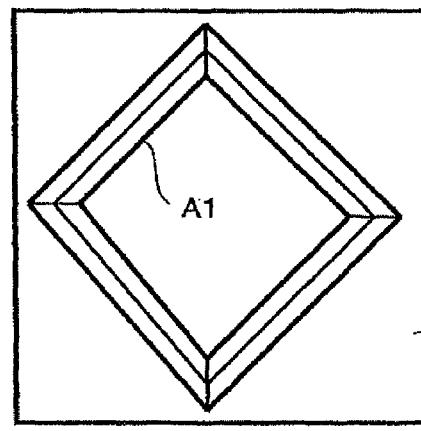
Figure 8:
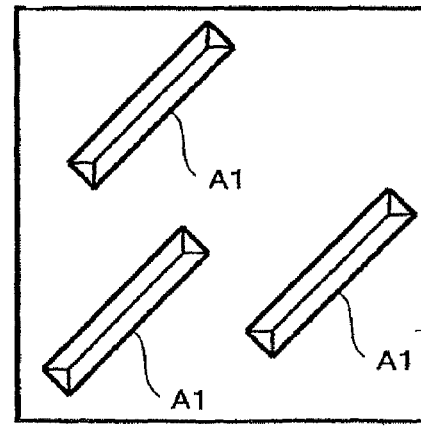
Figure 9:
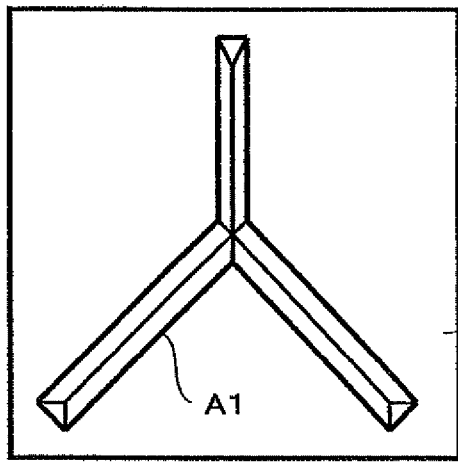
FIG. 9 is a view of a bottom surface of a nitride semiconductor layer with a light reflecting depression formed in it, in the nitride semiconductor light-emitting diode element according to an embodiment of the present invention.
Figure 9:
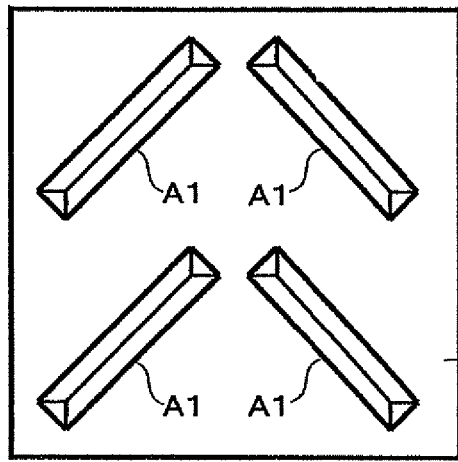
Figure 9:
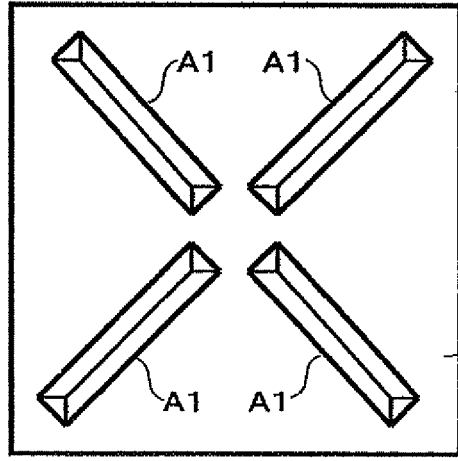

Other preferable embodiments of the linear light reflecting depression are shown in FIGS. 8 and 9. In each example in FIGS. 8(a) to 9(f), the linear light reflecting depression has a part extending in directions which crosses all the sides of the square bottom surface of the nitride semiconductor layer 12.

When the linear light reflecting depression has such part, the light propagating in the nitride semiconductor layer 12 is effectively reflected. It is because, when the light reflecting depression is linear, the light propagating in a direction parallel to its extending direction is not reflected by it, but in the case where the extending direction crosses all the sides of the bottom surface of the nitride semiconductor layer, the said light not being reflectable by the light reflecting depression changes its traveling direction by the reflection at the side surface of the nitride semiconductor layer to become the light reflectable by the light reflecting depression (the light propagating in the direction which crosses the extending direction of the light reflecting depression).

Thus, when providing a linear light reflecting depression in the bottom surface of the nitride semiconductor layer 12 whose outline shape is square, it is preferable to provide the linear light reflecting depression with a part extending in a direction crossing all the sides of the square at an angle from 10 to 80 degrees (hereinafter referred to as the "characteristic part"). The characteristic part preferably extends in a direction crossing all the sides of the square at an angle from 30 to 60 degrees, and further preferably extends in a direction crossing all the sides of the square at an angle of about 45 degrees (from 40 degrees to 50 degrees). The total length of the characteristic part contained in a linear light reflecting depression is preferably not less than 50%, more preferably not less than 100% and still more preferably not less than 150%, of the length of the diagonal line of the square.

Figure 3:
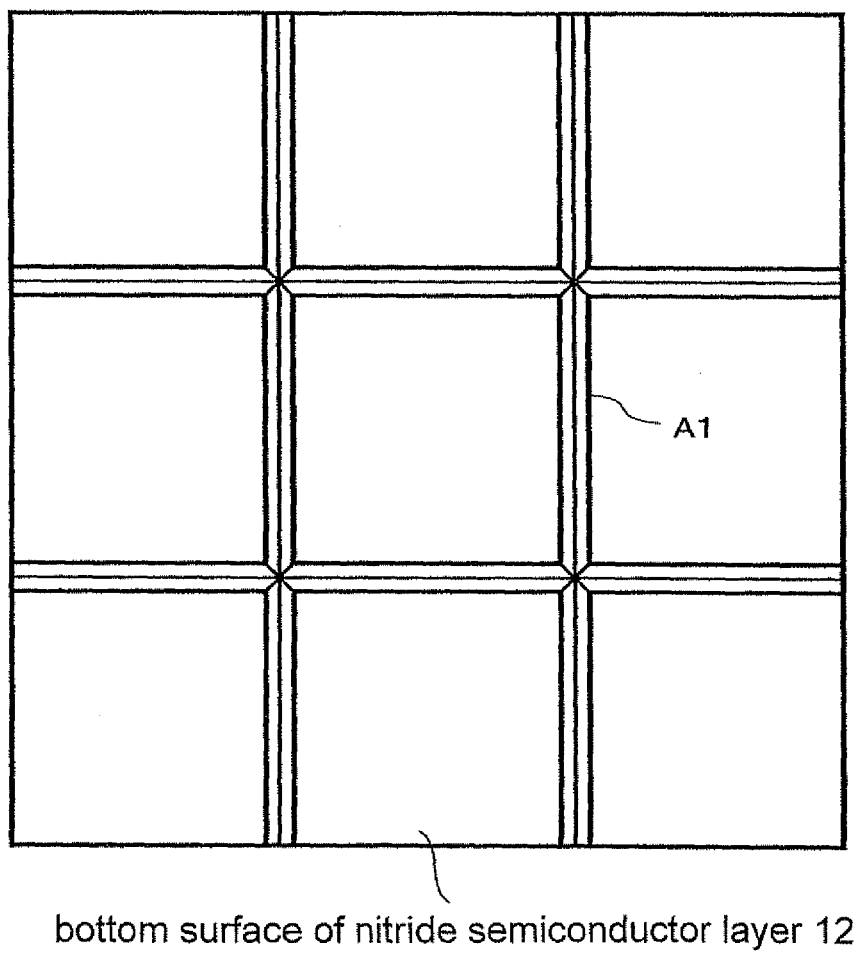
FIG. 3 is a view of a bottom surface of a nitride semiconductor layer with a light reflecting depression formed in it, in the nitride semiconductor light-emitting diode element according to an embodiment of the present invention.

The light reflecting depression A1 formed in the bottom surface of the nitride semiconductor layer 12 may be made into a lattice pattern consisting of linear depressions (grooves). FIG. 3 is a view of a bottom surface of the nitride semiconductor layer 12 with thus formed light reflecting depression A1, where the linear depressions form a square lattice pattern.

The lattice pattern is not limited to the square lattice pattern and may be another pattern. This embodiment is suitable for the case where an element size is large. More specifically, it is suitable for the case where the bottom surface of the nitride semiconductor layer 12 is 800 μm square or larger, and particularly for the case it is 1 mm square or larger. In addition, when the light reflecting depression is formed as a linear depression (groove), it may be a curved groove or a folded groove. Further, it may be annular groove or may have a branch or a crossing. Besides, the light reflecting depression may be a dot-shaped depression (hole) or both linear light reflecting depression and dot-shaped light reflecting depression may be provided.

The light reflecting depression may be formed such that its inner wall surface communicates with the side surface of the nitride semiconductor layer as shown in FIG. 3 or may be formed such that its inner wall surface does not communicate with the side surface of the nitride semiconductor layer as shown in FIG. 2(a) to (c), FIG. 8(a) to (c), and FIG. 9(d) to (f).

In addition, since the nitride LED 1 has the light reflecting depression A1 with a V-shaped cross section and an inclined side wall surface, the light reflected by the light reflecting depression A1 is incident upon the upper surface of the nitride semiconductor layer 12 within a critical angle with a high probability. In either case where the light reflecting depression has a linear shape or a dot shape, the light extraction efficiency is most effectively improved when employing the V-shaped cross section because the occupation ratio of the inclined side wall surface in the inner surface of the depression is highest. Here, the dot-shaped depression having a V-shaped cross section means a cone (circular or pyramidal cone)-shaped hole. The inclination of the side wall surface of the light reflecting depression is preferably from 30 to 60 degrees and more preferably about 45 degrees (from 40 degrees to 50 degrees).

The cross-sectional shape of the light reflecting depression may be a trapezoidal shape other than the V-shape and in this case also, since the side wall of the depression is an inclined surface, the light extraction efficiency is highly effectively improved. Here, the dot-shaped depression having the trapezoidal section means a frustum (circular or pyramidal frustum)-shaped hole.

The light reflecting depression may be the one diffusely reflecting the light propagating laterally in a nitride semiconductor layer to make its traveling direction random. Thus, the cross-sectional shape of the light reflecting depression is not limited to the V-shape and the trapezoidal shape, but also may be other shapes such as a U-shape, a rectangular shape, and an indefinite shape. By making the traveling direction of the propagating light random, the light extraction efficiency can be improved due to the suppression of multiple reflection.

In the nitride LED 1, since the light reflecting depression A1 is formed so as to reach the light emitting layer 12*b*, the light extraction effect is especially high. When employing a double heterostructure for the light emitting device structure of the nitride LED 1, as a typical configuration, the light emitting layer 12*b* may be made of a crystal containing InGaN and the p-type layer 12*a* and the n-type layer 12*c* may be mainly made of GaN or AlGaN. At this time, since the refraction index of InGaN is higher than that of GaN and AlGaN, a waveguide structure in which the light emitting layer 12*b* functions as a core is formed. That is, the light propagating in the layer direction in the nitride semiconductor layer 12 tends to be strongly confined in the light emitting layer 12*b*. Thus, by forming the light reflecting depression A1 to reach the light emitting layer 12*b*, the light can be effectively reflected. According to a more preferable embodiment, the light reflecting depression A1 is formed so as to reach the n-type layer 12*c*.

Meanwhile, when forming the light reflecting depression to reach the light emitting layer, as the area of the light reflecting depression formation region in the bottom surface of the nitride semiconductor layer is increased, the area of the light emitting layer is decreased. When the area of the light emitting layer is decreased, the temperature of the light emitting layer tends to become high during the device operation, which causes the problem that the light emitting efficiency is lowered and the problem that the lifetime and reliability of the element is reduced. To form the light reflecting depression A1 linearly like in the nitride LED 1 is effective in preventing the above problems.

It is because, as described above, the linear light reflecting depression can reflect the light propagating in the layer direction in the nitride semiconductor layer more effectively as compared with the dot-shaped light reflecting depression.

Thus, when forming the light reflecting depression in the bottom surface of the nitride semiconductor layer whose outline shape is square so as to reach the light emitting layer, it is preferred to form the light reflecting depression in a linear shape and the total length thereof is preferably not more than four times, more preferably not more than three times, and still more preferably not more than two times as long as the diagonal line of the square.

In addition, when forming the linear light reflecting depression from the surface of the p-type layer side to reach the light emitting layer as in the nitride LED 1, its width (a groove width at the surface of the p-type layer) is preferably not more than 5 µm, more preferably not more than 3 µm, and still more preferably not more than 1 µm. It is preferred that this width is larger than the film thickness of the p-type layer (set to be within a range from 0.1 µm to 0.5 µm in general) so that the inclination of the side wall surface of the light reflecting depression falls within the above-described preferable range.

A production method of the nitride LED 1 is described next.

Figure 4:
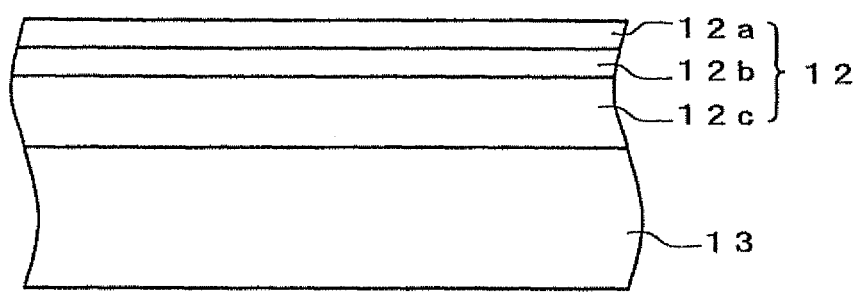
FIG. 4 is a view for explaining a production method of the nitride semiconductor light-emitting diode element shown in FIG. 1.
Figure 4:
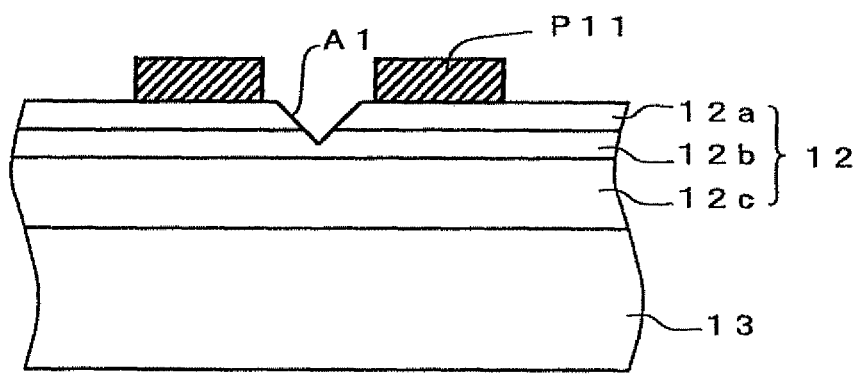
Figure 4:
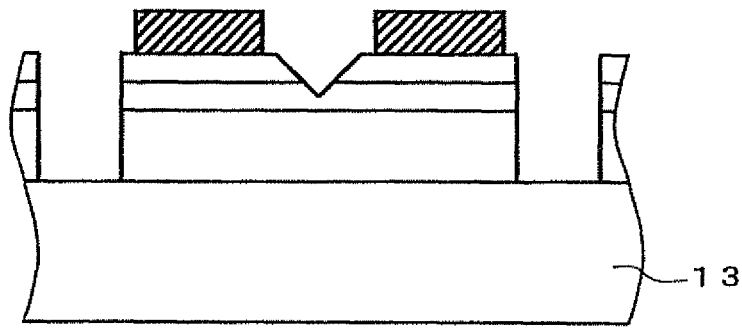

First, as shown in FIG. 4(*a*), a growth substrate 13 suitable for the epitaxial growth of the nitride semiconductor crystal such as a sapphire substrate, SiC substrate, GaN substrate, Si substrate or GaAs substrate is prepared, and the nitride semiconductor layer 12 is grown thereon orderly from the n-type layer 12*c* side by a MOVP method, HVPE method, or MBE method. Each layer of the n-type layer 12*c*, the light emitting layer 12*b*, and the p-type layer 12*a* may have a multilayer structure.

The n-type layer 12*c* is preferably formed to be 2 µm or more in thickness so that the crystallinity of the light emitting layer 12*b* to be grown thereon becomes good. In addition, it is preferable that a high carrier concentration layer (carrier concentration: $1 \times 10^{18}$ cm$^{-3}$ or more) having a thickness of 1 µm or more is provided in the n-type layer 12*c*. The light emitting layer 12*b* preferably has a multiple quantum well structure in which a well layer is made from InGaN or InGaAlN. An uppermost part of the p-type layer 12*a* is preferably made from GaN, AlGaN or InGaN doped with Mg (magnesium) at a high concentration ($8 \times 10^{19}$ cm$^{-3}$ or more) so as to obtain a low contact resistance with respect to the contact layer P11. In addition, for the n-type layer 12*c* and the p-type layer 12*a*, a crystal composition of the part adjacent to the light emitting layer 12*b* is preferably set to form a double heterostructure.

A crystal growth method having an effect of improving crystal quality such as ELO (Epitaxial Lateral Overgrowth) may be used appropriately. Various kinds of functional layers such as a superlattice layer for strain reduction may be properly introduced into the nitride semiconductor layer 12.

Then, as shown in FIG. 4(*b*), the light reflecting depression A1 is formed by etching the nitride semiconductor layer 12, and the contact layer P11 is formed on the p-type layer 12*a* except for the part where the light reflecting depression A1 is formed. Preferably, the contact layer P11 is formed first and then the light reflecting depression A1 is formed. The light reflecting depression A1 may be formed by mechanical processing with a scriber or a dicer.

The contact layer P11 is made from a metal or semiconductor forming a low contact resistance junction with a p-type nitride semiconductor. As preferable materials, ITO (indium tin oxide), Ni (nickel), Cr (chrome), Au (gold), and platinum group (Pt, Pd, Rh, Ir, Ru, Os) are exemplarily shown. A thin film known as an ohmic electrode for a p-type nitride semiconductor may be used as the contact layer P11.

The contact layer P11 may be formed of a light-transmissive thin film, and a silver-white metal layer made from such as Al, Ag, Pt and Ni serving as a light reflection film may be laminated thereon.

Then, as shown in FIG. 4(*c*), a mesa structure is formed. More specifically, the nitride semiconductor layer 12 is etched from the side of the p-type layer 12*a* to form a groove reaching the n-type layer 12*c* for isolating the adjacent elements on the wafer. Preferably, the growth substrate 13 is exposed in the bottom of the groove, like in this case. As the etching method, a dry etching method such as a reactive ion etching method is preferably used.

Figure 5:
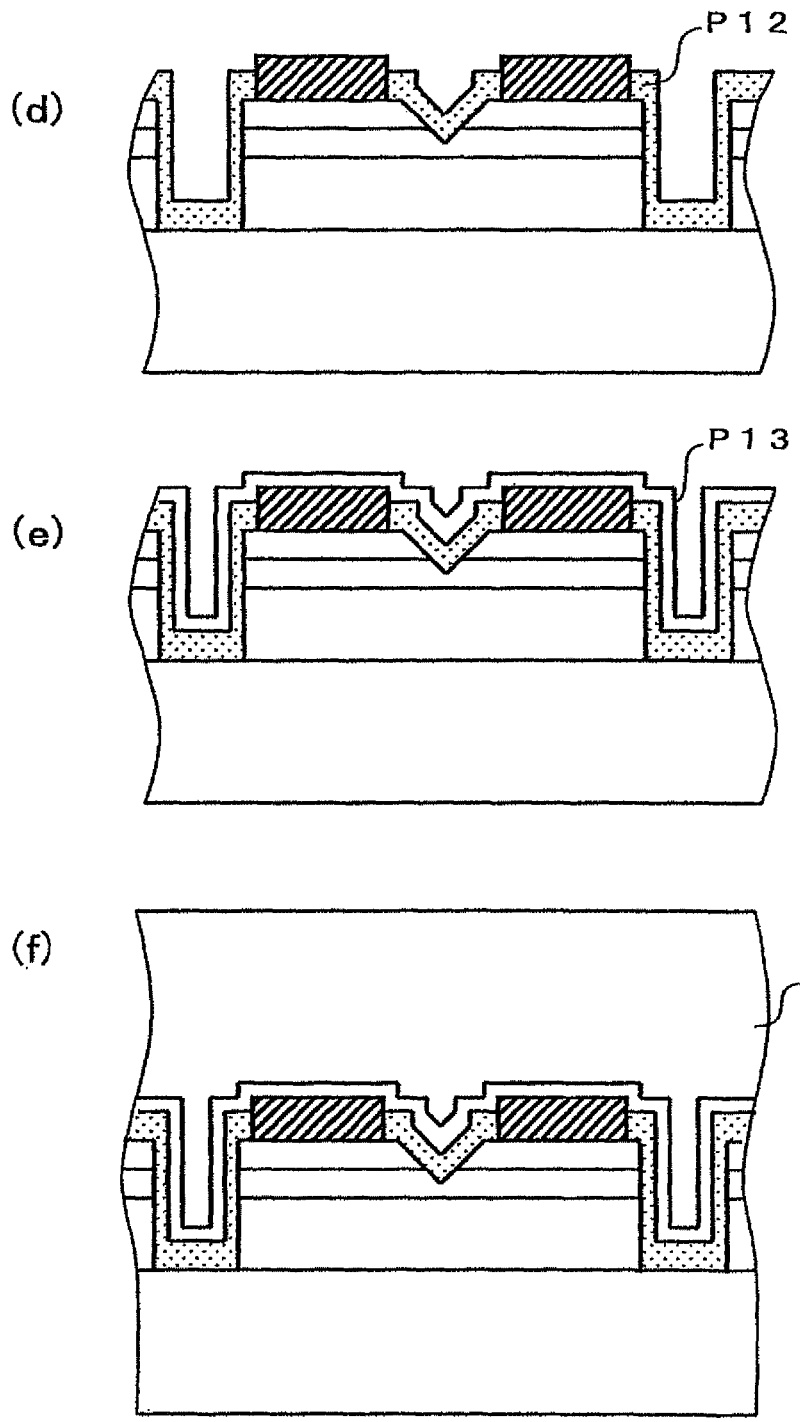
FIG. 5 is a view for explaining a production method of the nitride semiconductor light-emitting diode element shown in FIG. 1.

Then, as shown in FIG. 5(*d*), the wafer surface is covered with the insulation film P12 except for the region on the surface of the contact layer P11. The insulation film P12 is formed of a light-transmissive material. The insulation film P12 is preferably made from an inorganic material such as a metal oxide, metal nitride, metal oxynitride, or metal fluoride, and as specific materials, silicon oxide, silicon nitride, silicon oxynitride, aluminum oxide, spinel, zirconium oxide, magnesium oxide, titanium oxide, magnesium fluoride, and lithium fluoride are exemplarily shown. In order to improve the light reflectivity of the light reflecting depression A1, it is preferable to use a material having a low refractive index such as magnesium fluoride, lithium fluoride or silicon oxide. The insulation film P12 may be a multilayer film. Preferably, when the insulation film P12 is formed by a plasma. CVD method, the side surface of the nitride semiconductor layer 12 can be surely covered.

Then, as shown in FIG. 5(*e*), the thin-film metal layer P13 is formed so as to cover the wafer surface. The thin-film metal layer P13 is a plating base layer provided for forming the supporting substrate 11 by electroplating in a later step. The thin-film metal layer P13 is preferably formed also when forming the supporting substrate II by electroless plating. The thin-film metal layer P13 can be made from, for example, Cr, Pt, Pt/Au, Cr/Au, Ni/Au, Ti/Au, or TaN/Au.

In case of forming the supporting substrate 11 by dry plating such as vapor deposition, sputtering and CVD, although the thin-film metal layer P13 is not necessarily formed, even in this case, the thin-film metal layer P13 may be formed as a barrier layer to prevent an undesirable interaction (such as alloying reaction) between the metal composing the supporting substrate 11 and the contact layer P11.

Then, as shown in FIG. 5(f), the supporting substrate 11 is formed. The supporting substrate 11 is preferably formed by depositing a metal layer by electroplating or electroless plating. When the electroless plating is used, the surface of the crystal substrate side is coated with a polyimide layer and the like.

A material metal when forming the supporting substrate 11 by electroplating includes preferably, but not limited to, a metal widely used as an electrodeposition metal in electroforming such as Au (gold), Ni (silver), Cu (copper), and Ag (silver).

Figure 6:
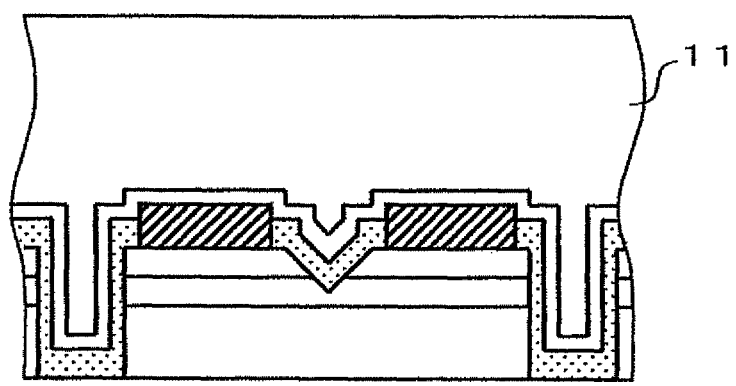
FIG. 6 is a view for explaining a production method of the nitride semiconductor light-emitting diode element shown in FIG. 1.
Figure 6:
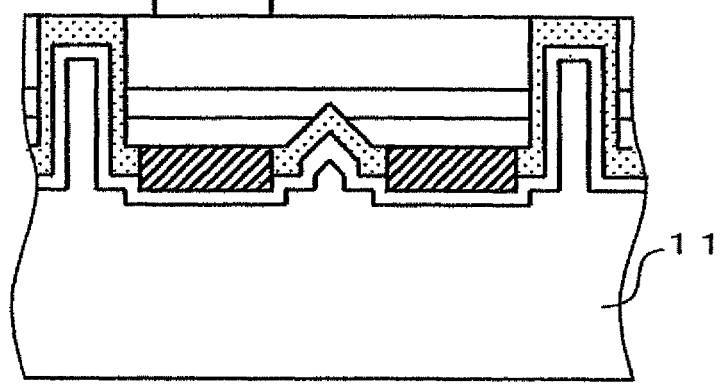

Then, as shown in FIG. 6(g), the growth substrate 13 is removed. For removing the growth substrate 13, a well-known method for separating a crystal substrate and an epitaxially grown layer formed thereon such as laser liftoff, wet etching, dry etching, grinding, and polishing may be optionally used.

After removing the growth substrate 13, as shown in FIG. 6(h), the pad electrode P14 is formed on the exposed n-type layer 12c. When the high carrier concentration layer is provided in the n-type layer 12c, the high carrier concentration layer is exposed and the pad electrode P14 is formed on the surface. The pad electrode P14 is preferably formed so as not to be provided above the light reflecting depression A1. In other words, the pad electrode P14 is preferably formed such that the light reflecting depression A1 is not positioned just under the pad electrode P14. Alternatively, a current diffusing electrode may be formed over the surface of the n-type layer 12c and the pad electrode P14 may be formed thereon instead of forming the pad electrode P14 directly on the n-type layer 12c.

As the current diffusion electrode, a transparent conductive film made from a transparent conductive oxide such as ITO and ZnO, or a metal thin film having an opening pattern may be used.

It is preferable that an insulation protective film is formed on the surface of the n-type layer 12c and the surface of the current diffusing electrode except for the part covered with the pad electrode P14.

Finally, the wafer is cut by a well-known dicing method, whereby the chip-form element (dice) is obtained.

With respect to the production method of the nitride LED 1, the patent document 1 can be also referred to, besides the above-described method.

Although the supporting substrate 11 is made from a metal in the nitride LED 1, the supporting substrate may be made from a semiconductor.

Figure 7:
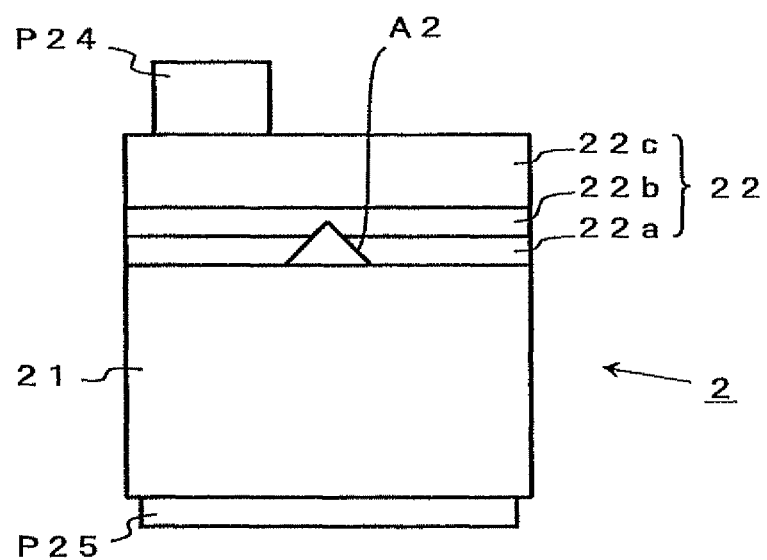
FIG. 7 is a cross-sectional view of a nitride semiconductor light-emitting diode element according to an embodiment of the present invention.

FIG. 7 is a cross-sectional view of a nitride LED according to an embodiment of the present invention, in which the supporting substrate is made from a semiconductor. The nitride LED 2 shown in this figure has a nitride semiconductor layer 22 laminated on a supporting substrate 21 made from a semiconductor. The supporting substrate 21 and the nitride semiconductor layer 22 are joined by direct wafer bonding.

The nitride semiconductor layer 22 has a p-type layer 22a, a light emitting layer 22b, and an n-type layer 22c in this order from the bottom surface side. A light reflecting depression A2 is formed in the bottom surface of the nitride semiconductor layer 22. A pad electrode P24 is formed on a part of the upper surface of the nitride semiconductor layer 22. A lower electrode P25 is formed on the back surface of the supporting substrate 21.

The semiconductor composing the supporting substrate 21 only needs to be the one being joinable to nitride semiconductor by direct wafer bonding. Preferably, the semiconductor composing the supporting substrate 21 has a bandgap energy higher than that of the light emitting layer 22b so that it does not strongly absorb the light generated in the light emitting layer 22b. When the emission wavelength of the light emitting layer 22b is 400 nm or more, ZnO (zinc oxide) is preferably used as the semiconductor composing the supporting substrate 21.

When forming the nitride LED 2, first, the n-type layer 22c, the light emitting layer 22b, and the p-type layer 22a are sequentially grown on a c-plane sapphire substrate serving as a growth substrate by a MOCVD method, whereby an LED wafer having the nitride semiconductor layer 22 laminated on the sapphire substrate is formed. At this time, the rms roughness measured by an AFM (Atomic Force Microscope) for 5×5 μm$^2$ area of the p-type layer 22a surface is preferably 0.55 nm or less.

Then, the nitride semiconductor layer 22 of the LED wafer is etched to form the light reflecting depression A2.

Then, the supporting substrate 21 made from a semiconductor is bonded to the surface of the nitride semiconductor layer 22 by direct wafer bonding method. For procedures when using a ZnO substrate as the supporting substrate 21, the non-patent document 1 can be referred to. That is, the ZnO substrate produced by a hydrothermal method having a film thickness of 500 μm, electrical resistivity of about 0.2Ω·cm, and rms roughness measured with AFM for 5×5 μm$^2$ surface area of 0.75 nm or less is preferably used.

The ZnO substrate is cleaned with acetone and isopropyl alcohol, rinsed with deionized water, and dried. The LED wafer is cleaned with acetone and isopropyl alcohol, dipped in a HCL solution for one minute, rinsed with deionized water, and then dried. Immediately after the cleaning process, the LED wafer and the ZnO substrate are stacked and heat-treated for one hour at 600° C. in a nitrogen gas atmosphere under an uniaxial pressure of 2 MPa in a clean room.

Thus, the ZnO substrate can be bonded to the nitride semiconductor layer of the LED wafer.

After the wafer bonding, the sapphire substrate used as the growth substrate is removed by a method such as a laser liftoff, wet etching, dry etching, grinding and polishing.

After removing the sapphire substrate, the pad electrode P24 is formed on the exposed surface of the n-type layer 22c, and the lower electrode P25 is formed on the back surface of the supporting substrate 21.

Then, the wafer is cut by the well-known dicing method, whereby the chip-form element (dice) is obtained.

At this time, by forming in advance the light reflecting depression into the shape fitting within the bottom surface of the nitride semiconductor layer 22 after dicing, such that the side surface of the nitride semiconductor layer 22 exposed by dicing does not communicate with the inner wall surface of the light reflecting depression A2, the light reflecting depression A2 does not open in the side surface of the nitride semiconductor layer 22 (the inside of the light reflecting depression A2 is isolated from the outside of the element), whereby a foreign material such as water is prevented from entering the light reflecting depression A2. Since the semiconductor is exposed in the light reflecting depression A2, when water enters it, the lifetime and reliability of the element are reduced.

Modified Embodiment 1

In the above embodiment 1, a light-transmissive substrate made from semiconductor such as a SiC substrate, GaN substrate, and ZnO substrate can be used as the growth substrate used for epitaxially growing the nitride semiconductor layer. The growth substrate is not necessarily removed from the structure of nitride LED being the final product. That is, a part or a whole of the growth substrate may be left in the element as a light-transmissive semiconductor layer bonded onto the upper surface of the nitride semiconductor layer.

In such embodiment leaving a part or a whole of the growth substrate as a light-transmissive semiconductor layer, the pad electrode may be formed on the surface of this light-transmissive semiconductor layer instead of forming it on the n-type nitride semiconductor layer.

An especially preferable growth substrate in this embodiment is the one having about the same refractive index as that of the nitride semiconductor layer (for example, a nitride semiconductor substrate such as a GaN substrate or an AlGaN substrate) or the one having a refractive index higher than that of the nitride semiconductor layer (for example, the SiC substrate). It is because, the light-transmissive semiconductor layer derived from such growth substrate has no effect of confining the light in the nitride semiconductor layer or the effect is weak if any.

In this embodiment, preferably, the surface of the light-transmissive semiconductor layer is processed to be rough so that the light will be easily emitted outside the element from the surface of the light-transmissive semiconductor layer. More preferably, the surface of the light-transmissive semiconductor layer is processed so as to have cone (circular or pyramidal cone)-shaped or frustum (circular or pyramidal frustum)-shaped projections whose cross-sectional area (cross-sectional area cut by a plane orthogonal to the thickness direction of the nitride semiconductor layer) decreases with the distance from the nitride semiconductor layer. Alternatively, the surface of the light-transmissive semiconductor layer is processed to have a cone shape, frustum shape or dome shape.

When forming the projection of cone-shape or frustum-shape, the height is preferably 0.1 μm or more. This height of the projection has no upper limit and may be 10 μm or more, 50 μm or more, or 100 μm or more. Practically, the upper limit of the projection height is limited by the film thickness of the residual growth substrate (the film thickness may be reduced by polishing). In an especially preferable example, the cone-shaped or frustum-shaped projections each having a height from 0.1 μm to 1 μm are closely formed.

The method for forming such projections is well known. For example, metal particles or polymer particles of submicron size are deposited at random on the surface to be processed and dry etching is performed using the particles as a mask under the condition that the mask itself is also etched. For more details, the patent document 3, the patent document 4, and the non-patent document 2 can be referred to.

As the method for forming a large cone-shaped or frustum-shaped projection along the surface of the light-transmissive semiconductor layer, a method by forming a groove with a V-shaped cross section in the surface using a blade with a V-shaped cross section is mentioned, and a method by etching processing is also preferably used. In addition, the patent document 5, the patent document 6 and the like can be also referred to.

For the method for processing the surface of the light-transmissive semiconductor layer to have a dome shape, the patent document 7, the patent document 8 and the like can be also referred to. A cone-shaped or frustum-shaped convex can be formed along the surface of a ZnO substrate by anisotropic etching with hydrochloric acid as etchant (non-patent document 1).

Modified Embodiment 2

It is explained that, in the nitride LED 1 according to the Embodiment 1, the contact layer P11 may be a light-transmissive thin film made from ITO (indium tin oxide), and a metal layer functioning as a light reflection film can be laminated thereon. By the way, the thin film of ITO tends to be polycrystalline, and depressions and protrusions as fine as 30 nm to 50 nm due to the polycrystalline structure exists on the surface of the ITO thin film formed by the normal method. When formed on the surface with such depressions and protrusions in it, the light reflection film made from a metal exhibits an increased loss due to light absorption at the reflection surface because of the increase in reflection surface area (microscopic area).

Thus, in case of employing the above-mentioned structure, in order to improve the surface planarity of the contact layer, it is preferable to polish the ITO film surface after the film formation. By doing so, the metal reflection film formed on the ITO film becomes good in planarity of the reflection surface (the surface in contact with the ITO film) and superior in reflectivity. When using this method, the ITO film for the contact layer P11 is formed on the whole upper surface of the p-type layer 12a, and after the surface polishing, the film is patterned into a predetermined contact layer shape by etching.

The surface roughness of the ITO film after polishing as measured by a stylus-type surface profiler is preferably less than 20 nm, more preferably less than 10 nm, and still more preferably less than 5 nm, in arithmetic means roughness (Ra) as an index. Although the polishing method is not limited, it is preferably CMP (Chemical Mechanical Polishing).

Preferably, a light-transmissive dielectric film may be interposed between the ITO contact layer and the light reflection film. By making this dielectric film from a material having a refractive index lower than that of the contact layer, the reflectivity of the light reflection film is improved. It is because a part of the light incident upon the light reflection film is reflected at an interface between the contact layer and the dielectric film due to a refractive index difference before it reaches the surface of the light reflection film, resulting in the reduction of the loss caused by the light absorption by the metal light reflection film. By increasing the planarity of the contact layer surface, diffused reflection is difficult to occur, resulting in that reflection efficiency at the interface between the contact layer and the dielectric film becomes higher. The preferable material of the dielectric film includes silicon oxide whose refraction index is as low as from 1.4 to 1.5. Other preferable low refraction index materials include metal fluorides such as magnesium fluoride and lithium fluoride and fluororesin. Magnesium fluoride and lithium fluoride are known to have a refractive index as low as 1.4 or less. In addition, when a current is supplied to the contact layer through the metal light reflection film, it is necessary to partially provide the dielectric film between the contact layer and the light reflection film so that the light reflection film and the contact layer are not insulated.

According to an embodiment, a dielectric multilayer film type reflection film may be laminated as the light reflection film, on the contact layer 211 composed of the ITO film whose surface is planarized by polishing. In this case also, as the planarity of the contact layer surface is higher, it becomes possible to control the film thickness of the dielectric thin film more strictly, and further, the disorder of the multilayer film structure is smaller, resulting in that the reflection characteristics of the light reflection film is improved. When laminating the dielectric multilayer film type reflection film on the contact layer, the surface of the contact layer should not be covered with the reflection film completely so that the supporting substrate joined to or formed on the light reflection film later can be electrically connected to the contact layer. For this purpose, an opening may be formed partially in the reflection film, or the size of the reflection film is made smaller than that of the contact layer.

The contact layer P11 may be made from an oxide semiconductor (conductive oxide) other than ITO, such as indium oxide, tin oxide, IZO (indium zinc oxide), AZO (aluminum zinc oxide), zinc oxide, FTO (fluorine-doped tin oxide). In addition, the contact layer may have a multilayer structure in which different oxide semiconductor films are laminated. The method for forming the contact layer with the oxide semiconductor is not limited and conventionally well-known method such as a sputtering method, reactive sputtering method, vacuum vapor deposition method, ion beam assisted vapor deposition method, ion plating method, laser ablation method, CVD method, spray method, spin coating method, or dip method, may be properly used depending on the kind of the oxide semiconductor. When forming the contact layer with an oxide semiconductor such as ITO that tends to be polycrystalline, the method for improving the surface planarity by film surface polishing is especially effective.

Embodiment 2

A nitride LED according to this embodiment has a conductive substrate, and a nitride semiconductor layer formed on the conductive substrate, and the nitride semiconductor layer includes an n-type layer arranged at the most distant position from the conductive substrate, a light emitting layer arranged between the n-type layer and the conductive substrate, and a p-type layer arranged so as to sandwich the light emitting layer with the n-type layer. The nitride LED has a characteristic structure that a pad electrode is formed on the n-type layer, and a flat hole having a bottom surface is formed in the surface of the nitride semiconductor layer on the conductive substrate side to reach at least the light emitting layer, so as to face the pad electrode.

Figure 10:
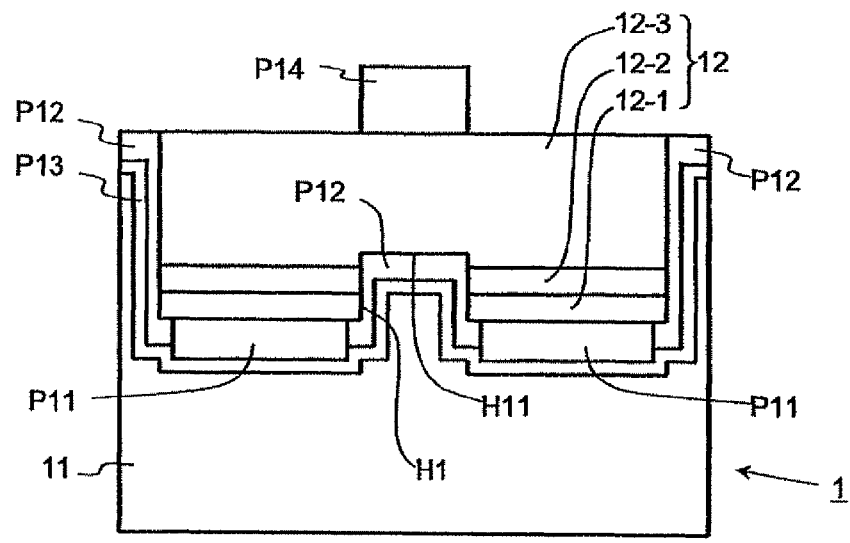
FIG. 10 is a cross-sectional view of a nitride semiconductor light-emitting diode element according to an embodiment of the present invention.

FIG. 10 shows the cross-sectional structure of the thus composed nitride LED. The nitride LED shown in FIG. 10 has a conductive substrate 11 made from a metal, and a nitride semiconductor layer 12 formed thereon. The nitride semiconductor layer 12 includes a p-type layer 12-1, a light emitting layer 12-2, and an n-type layer 12-3 from the conductive substrate 11 side in this order. A pad electrode 14 is formed on the n-type layer 12-3. A flat hole H1 having a bottom surface H11 is formed to reach the n-type layer 12-3 in the surface of the nitride semiconductor layer 12 on the conductive substrate 11 side, so as to face the pad electrode P14. A contact layer P11 is formed on the p-type layer 12-1 on the side opposite the side where the light emitting layer 12-2 is formed. An insulation film P12 is formed on the surface of the nitride semiconductor layer 12 on the conductive substrate 11 side and the side surface thereof except for the region where the contact layer P11 is formed. The thin film metal layer P13 is sandwiched between the contact layer P11 and insulation film P12, and the conductive substrate 11.

In the nitride LED shown in FIG. 10, since the conductive substrate 1 is made from a metal and is not light-transmissive, the light emitted from the light emitting layer 12-2 is extracted from the n-type layer 12-3 surface side. The flat hole H1 is formed in the surface of the nitride semiconductor layer 12 on the conductive substrate 11 side so as to face the pad electrode 14, so that the light is not generated just under the pad electrode 14. It is because, when allowing light generation just under the pad electrode, since the generated light suffers shielding and absorption by the pad electrode strongly, it cannot be efficiently extracted to the outside of the LED element, resulting in the loss of energy consumed by generating it. In other words, in the nitride LED shown in FIG. 10, the light generation is not allowed just under the pad electrode, whereby the loss is reduced and the output power is improved.

In addition, since the light emitting layer serves as an absorber of the light generated by itself, removal of an unnecessary part (a part not allowed to generate light) from the light emitting layer brings a preferable effect for the purpose of improving the output power of the LED element in an aspect of removing the origin of loss. In order to obtain this effect, while it is only necessary to form the flat hole to reach the light emitting layer, the flat hole is preferably formed to reach the n-type layer as in the nitride LED shown in FIG. 10, to completely remove the light emitting layer from where the flat hole is formed. In a nitride LED with a double heterostructure formed by making the In (indium) content of the light emitting layer higher than that of the clad layer, or making the Al (aluminum) content of the light emitting layer lower than that of the clad layer, since a slab waveguide structure where the light emitting layer serves as a core is formed, and the tendency of strong light confinement within the light emitting layer occurs, remarkable effect of improving the output power is brought by removing the unnecessary part from the light emitting layer.

Although the shape and size of the flat hole H1 are roughly the same as the shape and the size of the pad electrode P14 when viewed from the upper side of the n-type layer 12-3 in the nitride LED shown in FIG. 10, such configuration is not essential. As long as the pad electrode P14 overlaps with the flat hole H1 when viewed from the upper side of the n-type layer 12-3, the above-mentioned output power improving effect can be obtained, and when the area of the overlapping part is larger, the effect is larger.

Figure 11:
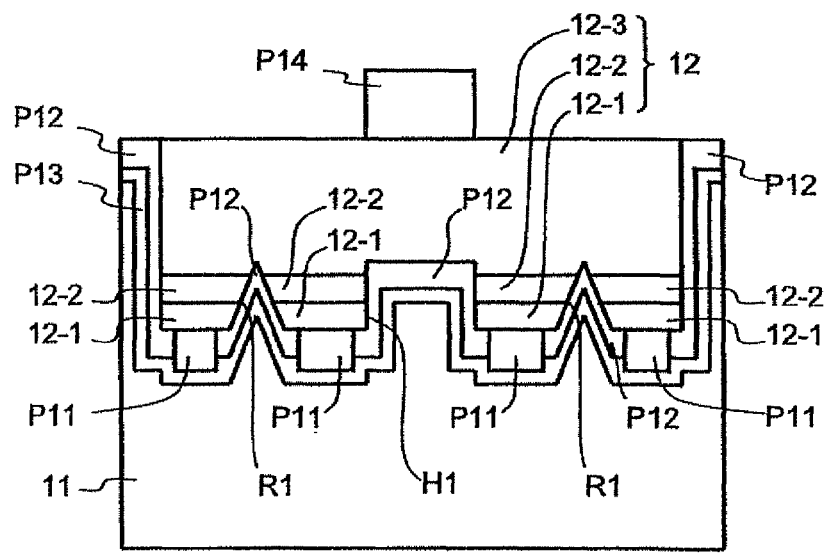
FIG. 11 is a cross-sectional view of a nitride semiconductor light-emitting diode element according to an embodiment of the present invention.

Preferably, as in an example shown in FIG. 11, a light reflecting depression R1 may be formed in the nitride semiconductor layer 12 on the side of the conductive substrate 11, in addition to the flat hole H1.

Next, a production method of the nitride LED shown in FIG. 10 is described.

First, a substrate suitable for epitaxially growing a nitride semiconductor crystal such as a sapphire substrate, SiC substrate, GaN substrate, Si substrate and GaAs substrate is prepared, and the nitride semiconductor layer 12 is formed by growing and laminating the n-type layer 12-3, the light emitting layer 12-2, and the p-type layer 12-1 thereon sequentially by a MOVPE method, HVPE method, or MBE method.

Then, the nitride semiconductor layer 12 is etched to form the flat hole H1, and contact layer P11 is formed on the p-type layer 12-1 in the region where the flat hole H1 is not formed. Preferably, the contact layer P11 is formed first and then the flat hole H1 is formed.

The contact layer P11 can be made from a metal forming a low contact resistance junction with a p-type nitride semiconductor, or made from a conductive oxide (oxide semiconductor) such as ITO (indium tin oxide), indium oxide, tin oxide, IZO (indium zinc oxide), AZO (aluminum zinc oxide) and zinc oxide.

The flat hole H1 can be formed by dry etching such as RIE (reactive ion etching), or wet etching. Especially, RIE using a substance containing chlorine such as $Cl_2$, $SiCl_4$, or $BCl_3$, as an etching gas is preferred.

When providing a light reflecting depression, the light reflecting depression is formed at this stage.

Then, similar to the case where the nitride LED 1 according to the embodiment 1 is produced, each of the steps of the mesa structure formation, the insulation film P12 formation, the thin-film metal layer P13 formation, the conductive substrate 11 formation, the growth substrate removal, the pad electrode P14 formation and the dicing, is performed sequentially.

Although the conductive substrate is made from a metal in the nitride LEDs shown in FIGS. 10 and 11, it can be made from a semiconductor instead of metal.

Figure 12:
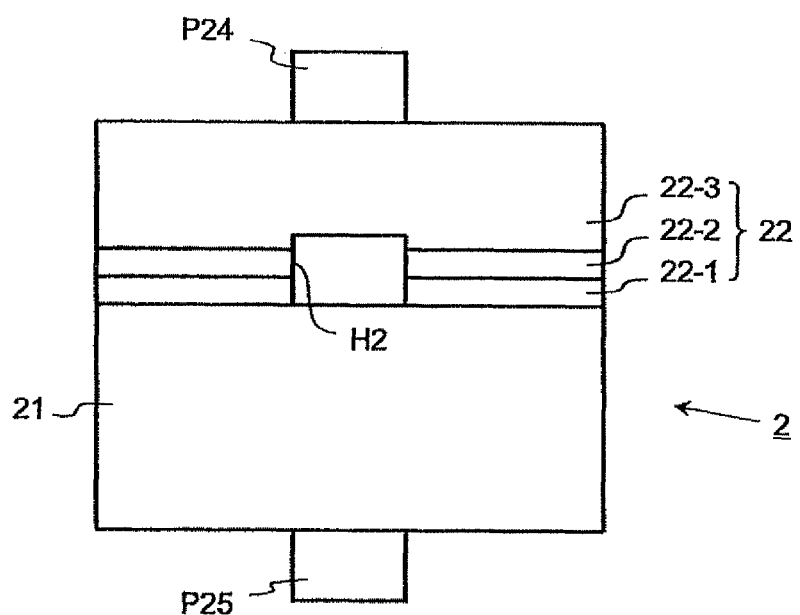
FIG. 12 is a cross-sectional view of a nitride semiconductor light-emitting diode element according to an embodiment of the present invention.

FIG. 12 is a cross-sectional view of a nitride LED according to an embodiment of the present invention in which a conductive substrate is made from a semiconductor. In the nitride LED shown in this figure, a nitride semiconductor layer 22 is formed on a conductive substrate 21 made from a semiconductor. The conductive substrate 21 and the nitride semiconductor layer 22 are bonded by direct wafer bonding. The nitride semiconductor layer 22 has a p-type layer 22-1, a light emitting layer 22-2, and an n-type layer 22-3 from the conductive substrate 21 side in this order. A flat hole H2 having a bottom surface is formed in the nitride semiconductor layer 22 on the conductive substrate 21 side to reach the n-type layer 22-3. A negative pad electrode 24 is formed on the n-type layer 22-3 so as to face the flat hole H2. A positive pad electrode P25 is formed on the back surface of the conductive substrate 21.

When producing the nitride LED shown in FIG. 12, first, using a c-plane sapphire substrate as a growth substrate, the n-type layer 22-3, the light emitting layer 22-2, and the p-type layer 22-1 are sequentially grown thereon by a MOCVD method to form a LED wafer in which the nitride semiconductor layer 22 is laminated on the sapphire substrate. At this time, the rms roughness measured by an AFM (Atomic Force Microscope) for 5×5 $\mu m^2$ area of the p-type layer 22-1 surface is preferably 0.55 nm or less.

Then, the nitride semiconductor layer 22 of the LED wafer is etched to form the flat hole H2.

Then, the conductive substrate 21 made from a semiconductor is bonded onto the surface of the nitride semiconductor layer 22 by direct wafer bonding method.

After the wafer bonding, the sapphire substrate used as the growth substrate is removed by a laser liftoff, wet etching, dry etching, grinding or polishing method. After removing the sapphire substrate, the negative pad electrode P24 is formed on the exposed surface of the n-type layer 22-3 so as to face the flat hole H2 and the positive pad electrode P25 is formed on the back surface of the conductive substrate 21. Then, the wafer is cut by a well-known dicing method, whereby a chip-form element (dice) is provided.

Figure 13:
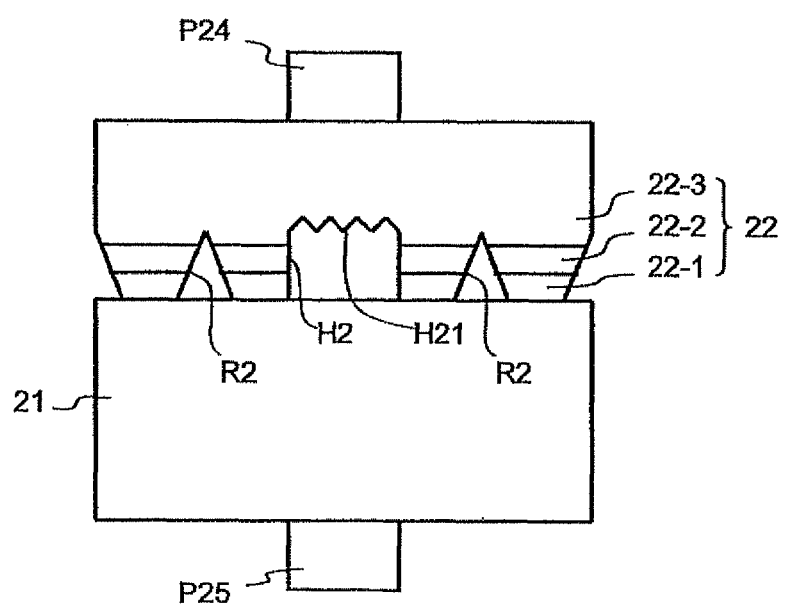
FIG. 13 is a cross-sectional view of a nitride semiconductor light-emitting diode element according to an embodiment of the present invention.

According to an embodiment, as shown in FIG. 13, a bottom surface H21 of the flat hole H2 may be textured. In addition, a light reflecting depression R2 may be formed in the nitride semiconductor layer 22, on the conductive substrate 21 side in addition to the flat hole H2. In addition, at least a part of the end face of the nitride semiconductor layer 22 may be inclined so that the area of the nitride semiconductor layer 22 on the conductive substrate 21 side is smaller than the area thereof on the opposite side.

When the nitride LED shown in FIG. 12 or 13 is fixed to a mounting base such as a substrate, a slag, a lead frame, and a unit substrate to provide a light emitting apparatus, the LED element can be fixed so that the surface on the conductive substrate 21 side faces the surface of the mounting base. When the conductive substrate 21 is light-transmissive, the LED element can be fixed so that the surface of the n-type layer 22-3 faces the surface of the mounting base.

The present invention is not limited to the embodiments expressly described above, and various modifications can be made without impairing the gist of the invention. For example, a nitride semiconductor light-emitting diode element according to an embodiment of the present invention may have a metal substrate or a semiconductor substrate joined to the bottom surface of the nitride semiconductor layer by wafer bonding using a bonding material such as a conductive paste or a solder.

Those skilled in the field of the nitride LED can understand that the invention disclosed by the Modified Embodiment 1 or 2 includes an invention showing an operational effect even when it is not practiced at the same time with the invention relating to the Embodiment 1 or 2. Such invention is shown below.

(a-1) A nitride semiconductor light-emitting diode element comprising:

a nitride semiconductor layer having a bottom surface and an upper surface and containing a light emitting layer inside, and, a supporting substrate made of a metal or a semiconductor, which is bonded to the bottom surface side of the nitride semiconductor layer, wherein a light-transmissive semiconductor layer derived from a semiconductor substrate used in growing the nitride semiconductor layer is bonded to the upper surface of the nitride semiconductor layer.

(a-2) The nitride semiconductor light-emitting diode element according to the above (a-1), wherein the light-transmissive semiconductor layer has the same refractive index as that of the nitride semiconductor layer or a refractive index higher than that.

(a-3) The nitride semiconductor light-emitting diode element according to the above (a-1), wherein the light-transmissive semiconductor layer is derived from a nitride semiconductor substrate or a SiC substrate.

(a-4) The nitride semiconductor light-emitting diode element according to any one of the above (a-1) to (a-3), wherein a surface of the light-transmissive semiconductor layer is processed to be rough.

(a-5) The nitride semiconductor light-emitting diode element according to the above (a-4), wherein a cone-shaped or frustum-shaped projection is formed on the surface of the light-transmissive semiconductor layer.

(a-6) The nitride semiconductor light-emitting diode element according to the above (a-5), wherein the height of the projection is from 0.1 $\mu m$ to 1 $\mu m$.

(a-7) The nitride semiconductor light-emitting diode element according to the above (a-5), wherein the height of the projection is 50 $\mu m$ or more.

(a-8) The nitride semiconductor light-emitting diode element according to any one of the above (a-1) to (a-3), wherein a surface of the light-transmissive semiconductor layer is processed to have a cone shape, frustum shape, or dome shape.

(b-1) A nitride semiconductor light-emitting diode element comprising a nitride semiconductor layer, wherein a light-transmissive electrode made of an oxide semiconductor is formed on the nitride semiconductor layer, and a surface of the light-transmissive electrode is planarized by polishing, and a reflection film is formed on the planarized surface of the light-transmissive electrode.

(b-2) The nitride semiconductor light-emitting diode element according to the above (b-1), wherein the diode element comprising a conductive substrate bonded to the nitride semiconductor layer, and provided with a laminated structure having the conductive substrate, the reflection film, the light-transmissive electrode, and the nitride semiconductor layer in this order.

(b-3) The nitride semiconductor light-emitting diode element according to the above (b-1), wherein the oxide semiconductor is an indium tin oxide.

(b-4) The nitride semiconductor light-emitting diode element according to the above (b-1), wherein the reflection film is a metal reflection film.

(b-5) The nitride semiconductor light-emitting diode element according to the above (b-4), wherein the metal reflection film is made from a simple substance of Ag, Al, Rh, Pt, Ir, Pd, Ru, or Os, or an alloy composed mainly of any one of the above-mentioned metal.

(b-6) The nitride semiconductor light-emitting diode element according to the above (b-4), wherein a light-transmissive dielectric film made from a material having a refractive index lower than that of the light-transmissive electrode is interposed between the light-transmissive electrode and the metal reflection film.

(b-7) The nitride semiconductor light-emitting diode element according to the above (b-1), wherein the reflection film is a dielectric multilayer film.

(b-8) The nitride semiconductor light-emitting diode element according to the above (b-7), wherein the reflection film further has a metal reflection layer laminated on the dielectric multilayer film.

INDUSTRIAL APPLICABILITY

According to the present invention, a nitride LED showing improved output power is provided.

This application is based on patent application Nos. 2006-287022, 2006-356835, 2007-020206 and 2007-036267 filed in Japan, the contents of which are incorporated in full herein by this reference.

The invention claimed is:

1. A nitride semiconductor light-emitting diode chip comprising
(a1) a GaN substrate,
(a2) a nitride semiconductor layer, formed on the GaN substrate, the nitride semiconductor layer having a laminated structure in which an n-type layer, a light emitting layer, and a p-type layer are laminated in this order from the GaN substrate,
(b) a light-transmissive electrode made of an oxide semiconductor formed on the nitride semiconductor layer, wherein a surface of the light-transmissive electrode has a surface roughness of less than 5 nm, in arithmetic means roughness (Ra) as an index,
(c) a reflection film formed on the surface of the light-transmissive electrode having the surface roughness of less than 5 nm, and
(d) a conductive substrate,
wherein the conductive substrate, the reflection film, the light-transmissive electrode, and the nitride semiconductor layer, and the GaN substrate in this order form a laminate structure, and
wherein a surface of the GaN substrate is rough such that the light emitted from the light emitting layer is extracted to the outside through the surface of the GaN substrate.

2. The nitride semiconductor light-emitting diode chip of claim 1, wherein the oxide semiconductor is an indium tin oxide.

3. The nitride semiconductor light-emitting diode chip of claim 1, wherein the reflection film is a metal reflection film.

4. The nitride semiconductor light-emitting diode chip of claim 3, wherein the metal reflection film is made from a simple substance of Ag, Al, Rh, Pt, Ir, Pd, Ru, or Os, or an alloy composed mainly of any one of the above-mentioned metals.

5. The nitride semiconductor light-emitting diode chip of claim 3, further comprising a light-transmissive dielectric film made from a material having a refractive index lower than that of the light-transmissive electrode and interposed between the light-transmissive electrode and the metal reflection film.

6. The nitride semiconductor light-emitting diode chip of claim 1, wherein the reflection film is a dielectric multilayer film.

7. The nitride semiconductor light-emitting diode chip of claim 6, wherein the reflection film further has a metal reflection layer laminated on the dielectric multilayer film.

8. The nitride semiconductor light-emitting diode chip of claim 1, wherein the surface having a surface roughness of less than 5 nm, in arithmetic means roughness (Ra) as an index, is (1) obtained by removing a surface layer having concave-convex parts naturally present due to a polycrystalline structure of the oxide semiconductor and (2) flatter than a surface having the concave-convex parts before removal.

* * * * *